United States Patent [19]

Leblanc

[11] 4,090,141

[45] May 16, 1978

[54] DEVICE FOR MEASURING THE TIME INTERVAL SEPARATING THE LEADING EDGES OF TWO CORRELATED PULSES WHICH HAVE INDEPENDENT AMPLITUDES AND RISE TIMES

[75] Inventor: Michel Leblanc, Antony, France

[73] Assignee: Agence Nationale de Valorisation de la Recherche (Anvar), France

[21] Appl. No.: 771,306

[22] Filed: Feb. 23, 1977

[30] Foreign Application Priority Data

Feb. 27, 1976 France ................................ 76 05469

[51] Int. Cl.[2] ........................ H03K 5/18; H03K 13/03

[52] U.S. Cl. .................................... 328/129; 324/181; 328/147; 328/150; 328/112

[58] Field of Search ................ 307/234, 360; 328/111, 328/112, 129, 147, 150; 324/181

[56] References Cited

U.S. PATENT DOCUMENTS

| | | | |
|---|---|---|---|
| 3,579,126 | 5/1971 | Paul | 328/129 |
| 3,601,706 | 8/1971 | Battle et al. | 328/112 |
| 3,634,869 | 1/1972 | Hsueh | 307/234 |
| 3,668,529 | 6/1972 | Meyer | 328/129 |
| 3,996,586 | 12/1976 | Dillon et al. | 328/111 X |
| 4,017,747 | 4/1977 | Sheng | 307/360 X |

*Primary Examiner*—John S. Heyman
*Attorney, Agent, or Firm*—Stevens, Davis, Miller & Mosher

[57] ABSTRACT

A device for measuring the time interval separating the appearances of two correlated pulses which have independent amplitudes and rise times includes two timing circuits. Each timing circuit includes a time to pulse height converter which is started by a threshold discriminator when the first pulse s passes through a preset amplitude threshold, and stopped by another threshold discriminator when the second pulse passes through the same threshold. The thresholds of the two timing circuits are different, and the output signal of each circuit is related to the duration of the interval to be measured by a respective conversion factor. The ratio of the two thresholds is equal to the ratio of these two conversion factors. A differential output circuit receives the timing circuit output signals and outputs a signal proportional to the difference in their amplitudes, which is also proportional to the duration of the interval to be measured. The device also includes control circuitry which inhibits the provision of an output signal if certain specified conditions are not satisfied, and which resets the device after each measurement or aborted measurement.

12 Claims, 8 Drawing Figures

MAIN TIME/PULSE HEIGHT CONVERTER

AUXILIARY TIME/PULSE HEIGHT CONVERTER

CONTROL CIRCUITRY

DEVICE FOR MEASURING THE TIME INTERVAL SEPARATING THE LEADING EDGES OF TWO CORRELATED PULSES WHICH HAVE INDEPENDENT AMPLITUDES AND RISE TIMES

BACKGROUND OF THE INVENTION

1. Field of the Invention

The invention is concerned with a device for measuring the time interval separating the leading edges of two correlated pulses which have independent amplitudes and rise times, such as the output pulses of devices for detecting correlated nuclear events.

2. Description of the Prior Art

It is often necessary, especially in the field of nuclear science, to determine accurately the time interval which separates two correlated events, each of which is signalled by an output pulse from a detector. In the field of energy spectroscopy, a first detector is sensitive to an event accompanying the emission or passage of a particle, and a second detector, at a known distance from the first, is sensitive to the impact of the particle. The time interval separating the two events is a function of the speed of the particle, and therefore of its energy. For measuring the period of radioactive elements for which the period is very short, use is made of a first detector which is sensitive to the transition which generates a nuclide of the element and of a second detector which is sensitive to the break up of the nuclide. The period can then be calculated by statistically weighting the time intervals measured for a large number of nuclides.

The time interval between the pulses which mark the two events is often measured with the aid of a timing circuit which includes a time to pulse height converter and two threshold discriminators, the first of which responds to the first pulse passing through a preset amplitude threshold by starting the converter, and the second of which responds to the second pulse passing through the preset amplitude threshold by stopping the converter. A typical time to pulse height converter consists of a capacitor, a constant current source, first switching means connected between a voltage source and the capacitor, and second switching means with an input connected to the constant current source, a first output connected to the capacitor, and a second output connected to ground. The triggering of the first threshold discriminator breaks the connection between the voltage source and the capacitor, which begins to charge from the constant current source, and the triggering of the second threshold discriminator shorts the constant current to ground, interrupting the charging of the capacitor. The voltage to which the capacitor is charged, in relation to that of the voltage source, is related to the time separating the triggering of the two threshold discriminators by a particular conversion factor. This voltage can pass through a linear gate which is temporarily opened when charging is interrupted to form an output pulse with a height which represents the duration of the time interval to be measured. These output pulses can be fed to a multichannel analyser which counts the output pulses in various predetermined amplitude ranges.

Since the pulses which mark the beginning and the end of the time interval to be measured must be distinguished from the background noise from the detectors, the thresholds of the threshold discriminators cannot be set to very low values which the pulses would pass through as soon as they appear. If the pulses had very short rise times, or if the pulses at the beginning and the end of the interval were of the same shape and amplitude, the time between the triggering of the first threshold discriminator and that of the second would be equal to the duration of the time interval to be measured. In practice, different types of detector may be used to signal the beginning and the end of an interval, and the detectors may have rise times which are not negligible in comparison with the interval to be measured. Also, the amplitude and rise time of each pulse may depend on the energy of the event in question. Such measurements are subject to serious error.

With a view to reducing these errors, when the detectors and associated equipment provide pulses at the beginning and end of an interval which have the same rise time but different amplitudes, so-called 'constant fraction of pulse height' threshold discriminators are used. In such discriminators, an incident pulse is fed through two paths. In one leg of the system the input pulse is attenuated to a given fraction of its original height, and in the other the pulse is inverted and delayed by an amount approximately equal to the rise time. These two signals are added together, and the threshold discriminator is set to respond to the combined signal passing through zero amplitude. This zero-crossing occurs when the extension of the rising edge of the delayed pulse is of the same amplitude as the attenuated pulse, and therefore when the pulse delayed by a known amount passes through a known fraction of the amplitude of the delayed pulse. If the rise times of the pulses at the beginning and end of the interval are equal, the moments at which the two threshold discriminators are triggered will also be delayed relative to the appearance of the pulses, the delay being equal to the delay introduced in the second signal path plus the fraction of the rise time corresponding to the passage of the pulse extension through the known fraction of the pulse amplitude.

With a view to reducing errors in measuring the time interval separating two pulses with independent amplitudes and rise times, so-called 'constant delay' threshold discriminators are used. an input pulse is fed through two paths. In a first path the pulse is attenuated, generally to half its original amplitude, and in the second path the pulse is inverted and delayed by an amount less than one half the rise time. These two signals are summed and passed to a threshold discriminator which is set to trigger when the summed signal passes through zero amplitude. If it is assumed that the rising edge of the pulse is linear, if the attenuation ratio in the first signal path is $\frac{1}{2}$, the discriminator is triggered after a delay from the appearance of the pulse which is equal to twice the delay introduced in the second signal path.

The use of constant fraction of pulse height and constant delay threshold discriminators has certain disadvantages: the two signal paths include circuits which extend the pulse rise times and which can introduce distortion, and triggering on the zero-crossing of the summed signal is subject to error due to the background noise, especially if the pulses have long rise times or low amplitudes. This amplitude is decreased by the error-correcting process itself.

SUMMARY OF THE INVENTION

The object of the invention is a device for measuring the time interval separating the leading edges of first and second correlated pulses which have independent amplitudes and rise times, the device using threshold discriminators which trigger at levels above the background noise and being less subject to error in the measurement of said time interval.

Another object of the invention is a measuring device of the above-defined type in which the triggering of the threshold discriminators is not subject to a delay.

A further object of the invention is a measuring device of the above-defined type in which the pulses marking the beginning and end of the time interval to be measured are input directly to the threshold discriminators, without passing through delay or attenuation circuitry.

With these objects in view, the invention consists in a device for measuring the time interval separating the leading edges of first and second correlated pulses which have independent amplitudes and rise times, said device comprising:

(a) a first timing circuit including a first time to pulse height converter, a first threshold discriminator which responds to the first pulse passing through a first preset amplitude threshold by starting said first converter, and a second threshold discriminator which responds to the second pulse passing through said first preset amplitude threshold by stopping said first converter, the output signal of said first timing circuit being related to the duration of said time interval by a first conversion factor specific to said first timing circuit;

(b) a second timing circuit including a second time to pulse height converter, a third threshold discriminator which responds to the first pulse passing through a second preset amplitude threshold by starting said second converter, and a fourth threshold discriminator which responds to the second pulse passing through said second preset amplitude threshold by stopping said second converter, the output signal of said second timing circuit being related to the duration of said time interval by a second conversion factor specific to said second timing circuit; and (c) a differential output circuit which receives the output signals from said first and second timing circuits and provides at its output a signal proportional to the difference between the amplitudes of said timing circuit output signals, the arrangement of said first and second timing circuits being such that the ratio of said first to said second preset amplitude threshold is equal to the ratio of said second to said first timing circuit conversion factor, whereby the output signal from said differential output circuit is proportional to the duration of said time interval.

If $T_o$ is the time separating the leading edges of the pulses defining the beginning and end of the time interval to be measured, and if T is the time separating the instants at which the rising fronts of the pulses pass through the same amplitude, then, assuming the rising fronts of the pulses are linear, the difference between T and $T_o$ will be proportional to the amplitude defining T, with a coefficient of proportionality equal to the difference between the slopes of the rising fronts. The first timing circuit will therefore indicate $T_1 = T_o + t_1$ and the second will indicate $T_2 = T_o + t_2$. If the ratio of the thresholds for the first and second timing circuits is $m$, then $t_1 = m\cdot t_2$, whence:

$$T_o = (T_1 - m\cdot T_2)/(1 - m) \qquad (1)$$

If the overall conversion factor of a timing circuit is $k$, its output voltage $u$ in response to a duration T will be $u = k\cdot T$, whence:

$$T_o = (u_1/k_1 - m\cdot u_2/k_2)/(1 - m) \qquad (2)$$

If $k_1$ and $k_2$ have values such that $k_2 = m\cdot k_1$, then:

$$T_o = (u_1 = u_2)/K_1\cdot(1 - m) \qquad (3)$$

The amplitude of the differential output signal of the differential output circuit is therefore representative of the duration of the time interval separating the leading edges of the pulses which define the beginning and the end of the period to be measured, without any delay or attenuation being applied to the pulses. The threshold discriminators trigger at defined levels and not at a zero-crossing.

The ratio of said first and second preset amplitude thresholds is preferably ½, a value which is easy to realise and which provides a good compromise between accuracy and sensitivity.

The device preferably comprises a variable reference voltage source and a potential divider connected across said source, the dividing ratio of said potential divider being equal to the ratio of said first and second preset amplitude thresholds, each of said threshold discriminators having an input for setting a threshold value, said threshold-setting inputs of said first and second threshold discriminators being connected to the intermediate point on said potential divider, and said threshold-setting inputs of said third and fourth threshold discriminators being connected to said source, each of said threshold discriminators also having a signal input, said signal inputs of said first and third threshold discriminators being connected to receive said first pulse and said signal inputs of said second and fourth threshold discriminators being connected to receive said second pulse.

Alternatively, the device may comprise first and second variable reference voltage sources and respective first and second potential dividers connected across said sources, the dividing ratio of each of said potential dividers being equal to the ratio of said first and second preset amplitude thresholds, each of said threshold discriminators having an input for setting a threshold value, said threshold-setting inputs of said first and second threshold discriminators being connected to the intermediate points on said first and second potential dividers, respectively, and said threshold-setting inputs of said third and fourth threshold discriminators being connected to said first and second sources, respectively, each of said threshold discriminators also having a signal input, said signal inputs of said first and third threshold discriminators being connected to receive said first pulse and said signal inputs of said second and fourth threshold discriminators being connected to receive said second pulse.

Said first and second time to pulse height converters preferably have the same intrinsic conversion factor, and said differential output circuit preferably includes a potential divider and a differential amplifier with a high intrinsic gain, the differential amplifier having an output which is connected to one end of said potential divider, which has its other end connected to the output of said second threshold discriminator, an inverting input which is connected to the intermediate point on said potential divider, and a non-inverting input which is connected to the output of said first threshold discriminator, the dividing ratio of said potential divider being equal to the ratio of said first and second preset amplitude thresholds, whereby the ratio of the overall conversion factor of the first to said second timing circuits is equal to the ratio of said second to said first preset amplitude threshold.

If the dividing ratio of this potential divider is $m$, then the output voltage S of the differential amplifer is:

$$S = (u_1 - m \cdot u_2)/(1 - m) \quad (4)$$

To provide an output pulse with an amplitude which corresponds to the measured time interval, the device preferably comprises a linear gate in said differential output circuit and control circuitry connected to a control input of said linear gate, said control circuitry including: a coincidence gate in the form of a three-input OR gate, triggering of said third threshold discriminator causing the first input of said OR gate to be set to "0" immediately and triggering of said fourth threshold discriminator causing the second input of said OR gate to be set to "0" immediately and the third input of said OR gate to be set to "1" after a predetermined delay; a delay monostable connected to the output of said OR gate and which is triggered to a "0" at said output; and a driver monostable which is triggered by the output of said delay monostable, the output of said driver monostable being connected to said control input of said linear gate, which opens in response to an output signal from said driver monostable.

The "0" at the output of the OR gate and which triggers the delay monostable corresponds to the simultaneous presence of three "0" signals on the inputs of the OR gate. The third input remains at "0" for only a short time once the second input goes to "0", so the first input must be at "0" before the second input, if the delay monostable is to be triggered. No measurement pulse can be output through the linear gate unless the first and second pulses go through the preset amplitude threshold in the correct order.

Said second and fourth threshold discriminators may have respective inhibit inputs which are activated in response to the triggering of said third threshold discriminator to prevent further triggering of said second and fourth discriminators.

In a preferred embodiment of the invention, the device further comprises: a first auxiliary time to pulse height converter which is started in response to triggering of said first threshold discriminator and stopped in response to triggering of said third threshold discriminator; a fifth threshold discriminator connected to the output of said first auxiliary time to pulse height converter; a second auxiliary time to pulse height converter which is started in response to triggering of said second threshold discriminator and stopped in response to triggering of said fourth threshold discriminator; a sixth threshold discriminator connected to the output of said second auxiliary time to pulse height converter; and a control circuit which provides an output signal in response to the delayed trailing edge of the first pulse or to the triggering of the fifth or sixth threshold discriminator in response to the output of the first or second auxiliary time to pulse height converter passing through a preset amplitude threshold, each of the first, second, third and fourth threshold discriminators having a reset input which is connected to the output of said control circuit, the discriminators being reset in response to a signal on said output.

The preset amplitude thresholds of said fifth and sixth threshold discriminators correspond to predetermined slopes of the leading edges of the first and second pulses, the effect being that the device does not provide an output signal for an interval if either of the pulses defining the interval has too small a rise time. A gate may be connected between said fifth and sixth threshold discriminators and the input of said control circuit, said gate having a control input which is connected to the output of said delay monostable and opening in response to a signal on said control input. This prevents premature action of the fifth and sixth threshold discriminators.

The device preferably comprises a seventh threshold discriminator which is connected to the output of said first time to pulse height converter, said control circuit being also responsive to the triggering of said seventh threshold discriminator. The seventh threshold discriminator is triggered if a second pulse does not occur within a predetermined period from the occurrence of the first pulse, and the effect is to reset the first, second, third and fourth threshold discriminators.

The control circuitry preferably comprises a monostable which outputs a pulse to said reset inputs of said first, second, third and fourth threshold discriminators, and to inhibit inputs of said delay and driver monostables. The linear gate cannot be opened when a reset signal is generated.

The control circuitry preferably also comprises a gate which is opened in response to the triggering of said first threshold discriminator to feed said output pulse from said monostable to a control input of said control circuit. This is to prevent a start pulse triggering the first threshold discriminator during the reset pulse.

These and other objects and advantages of the invention will emerge from the following description of an example of the invention, when considered in connection with the accompanying drawings.

DESCRIPTION OF THE PREFERRED EMBODIMENT

Figure 1:
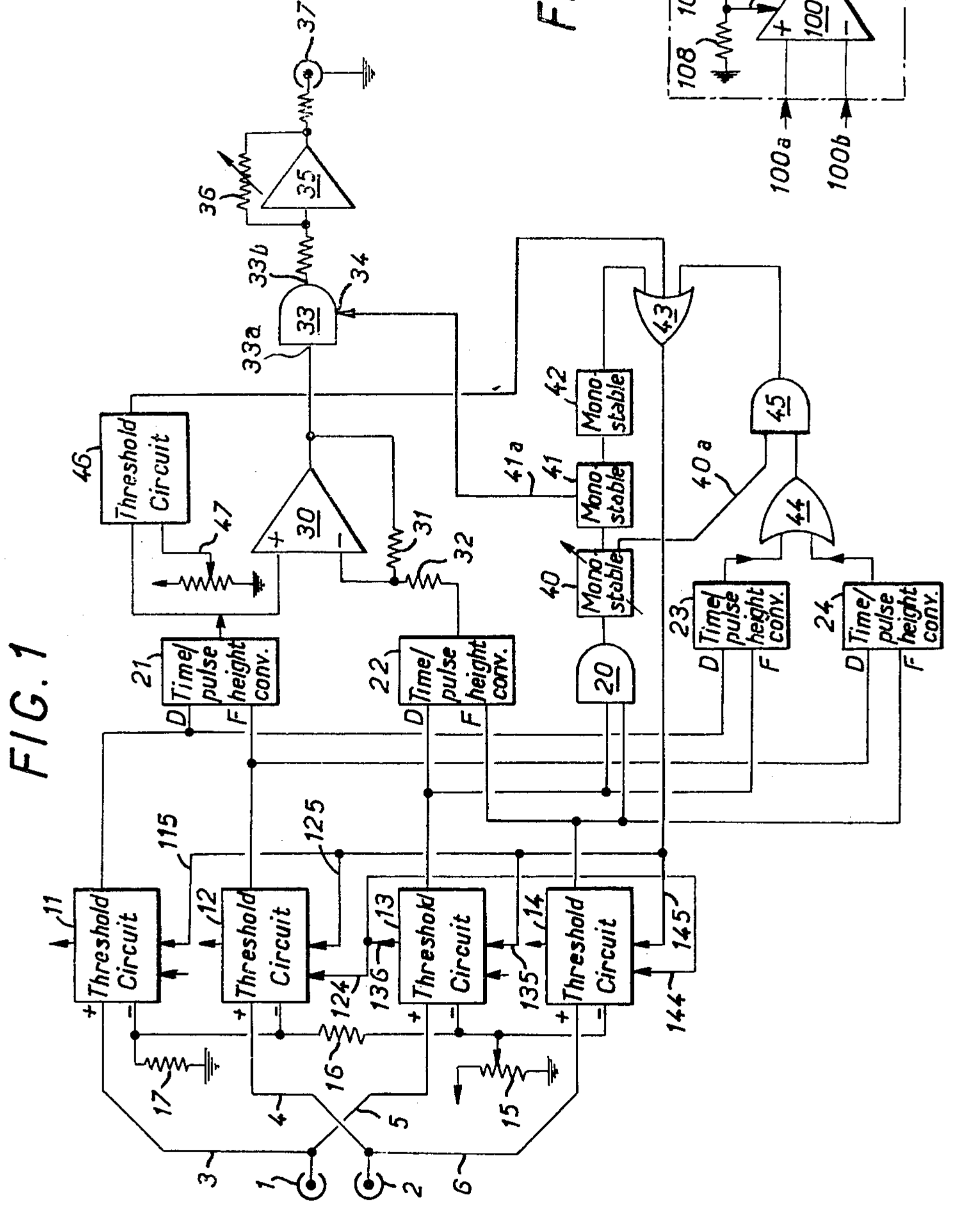
FIG. 1 is a block schematic of a device according to the invention.

Referring to FIG. 1, the device has two input terminals 1 and 2 which respectively receive the correlated first and second pulses which mark the beginning and the end, respectively, of a time interval to be measured. These pulses may be generated by nuclear particle detectors, for example, especially semiconductor detectors. Input terminal 1 is connected by a conductor 3 to a signal input (+) of a first threshold discriminator 11, and by a conductor 5 to the signal input of a third threshold discriminator 13. Input terminal 2 is connected by respective conductors 4 and 6 to the signal inputs of second and fourth threshold discriminators, respectively 12 and 14. The threshold discriminators will be described in more detail below, and each also has a threshold value setting input (−). The threshold-setting inputs of discriminators 13 and 14 are connected to the slider of a potentiometer 15 which is connected to a voltage source (not shown) and which therefore constitutes a variable reference voltage source. The treshold-setting inputs of discriminators 11 and 12 are connected to the intermediate point of a potential divider comprising resistors 16 and 17. This potential divider is connected between the slider of the potentiometer 15 and ground, i.e. across the variable reference voltage source.

The outputs of the discriminators 11 and 12 are respectively connected to the start input (D) of a first time to pulse height converter 21 and to the stop input (F) of the same converter. The outputs of the discriminators 13 and 14 are respectively connected to the start and stop inputs of a second time to pulse height converter 22. These converters will be described in more detail below.

The output of converter 21 is connected to the non-inverting input (+) of a differential amplifier 30. The output of converter 22 is connected to the output of the amplifier 30 through a potential divider comprising resistors 31 and 32, the junction of the resistors 31 and 32 being connected to the inverting input (−) of the differential amplifier 30. The resistor 31 is thereby connected between the output of the differential amplifier 30 and its inverting input.

The output of the differential amplifier 30 is also connected to the input of a linear gate 33 which has a control input 34. A linear gate is a circuit which provides no output if there is no enabling signal on its control input, whereas if there is an enabling signal on the control input 34 the voltage at the output **33*b* is equal to the voltage on the input 33*a*. The output 33*b* of the linear gate 33 is connected to the input of an amplifier 35 shunted by a variable feedback resistor 36 for varying the overall gain. The output of the amplifier 35 is connected to the output terminal 37** of the device.

The outputs of threshold discriminators 13 and 14 are connected to a coincidence gate 20 which has an "AND" function. This gate and its function will be described in more detail with reference to FIG. 5. The gate 20 drives a delay monostable 40 which has a variable time constant. The trailing edge of the pulse from the delay monostable 40 triggers a drive monostable 41 which has an output **41*a* connected to the control input 34 of the linear gate 33, so that this gate is held open during the pulse from the drive monostable 41. The trailing edge of the pulse from the drive monostable 41 triggers a third monostable 42, which outputs a reset pulse to discriminators 11 to 14 through an OR gate 43**. This part of the circuit will also be described in more detail below.

The outputs of threshold discriminators 11 and 13 are also connected to start and stop inputs, respectively, of a first auxiliary time to pulse height converter 23, and the outputs of discriminators 12 and 14 are likewise connected to the start and stop inputs, respectively, of a second auxiliary time to pulse height converter 24. These auxiliary converters will be described in more detail below, and each is connected to a built-in threshold discriminator. Their outputs are connected to respective inputs of a gate 44 which has an "OR" function, the output of which is connected to one input of a gate 45 which has an "AND" function. These two gates will be described in more detail with reference to FIG. 5. The gate 45 has a second input which receives an output pulse from the delay monostable 40 over a connection **40*a*. The gate 45 has its output connected to an input of the gate 43**.

The output of the time to pulse height converter 21 is also connected to the input of a threshold discriminator 46. This is the seventh discriminator in the device, the fifth and sixth being those built into the converters 23 and 24. Its threshold is set by a potentiometer 47 connected across a voltage source (not shown). The output of the seventh discriminator 46 is connected to an input of the gate 43.

Figure 2:
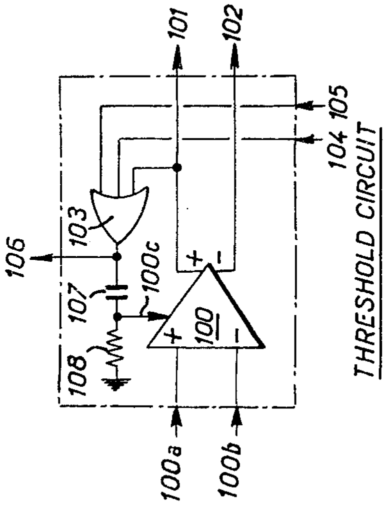
FIG. 2 is a block schematic of a principal threshold discriminator.

As shown in FIG. 2, each of the discriminators 11 to 14 includes a comparator 100 with inputs **100*a* (+) and 100*b* (−), a holding input 100*c*, and outputs 101 (+) and 102 (−). When there is a positive or zero voltage on the input 100*c*, the comparator is responsive to the difference between the voltages on inputs 100*a* and 100*b*. If the difference is a positive voltage, output 101 is positive and output 102 is negative. If the difference is a negative voltage, output 101 is negative and output 102 positive. If the voltage on the holding input 100*c* is negative, however, the comparator is locked in whichever state it was in when that input went negative. The input 100*c* is grounded through a resistor 108 and is also connected to the output of an OR gate 103 through a capacitor 107. The capacitor 107 and resistor 108 define a time constant of about 50 microseconds, which is much longer than the time intervals to be measured. A first input of the gate 103 is connected to the output 101 of the comparator 100. The gate 103 has two other inputs 104 and 105** for external connections.

The threshold discriminator shown in FIG. 2 operates in the following manner:

In the ready or waiting state, there is no voltage on input **100*a*, a negative threshold-setting voltage on input 100*b*, and no voltage on input 100*c*. Output 101 is positive and output 102 negative. The output 106 of the OR gate 103 is set at "1, " since at least the input connected to output 101 is positive. When the leading edge of a negative-going pulse applied to input 100*a* reaches the amplitude set by the voltage on input 100*b*, the voltage on output 101 drops and that on output 102 rises. If the external inputs 104 and 105 of gate 103 are both at "0, " the gate transmits a "0" to its output, so that the input 100*c* goes negative, to hold the comparator 100 in its triggered state with output 101 negative and output 102 positive. If either of the inputs 104 and 105 is at "1, " however, the output 106 of the gate 103** would stay at "1" and triggering would not be confirmed.

When the comparator 100 is in the triggered state, with its output 101 negative and its output 102 positive, if a "1" is applied to either of the inputs 104 or 105 of the gate 103, the output of the gate goes to "1," which is passed through the capacitor 107 to the holding input **100*c* of the comparator, which means that the comparator can be reset to the ready or waiting state. This occurs spontaneously, since there is no "1" on the output 106 of the gate 103 and the capacitor 107 discharges through the resistor 108**.

Referring back to FIG. 1, the inputs 105 of the four discriminators 11 to 14 are referenced 115, 125, 135 and 145, respectively, and are all connected to the output of the gate 43, so that a "1" at this output resets all four discriminators simultaneously. The inputs 115, 125, 135 and 145 are the reset inputs of the discriminators. Also, the output of the discriminator 13 which is referenced 136 in FIG. 1 is that referenced 106 in FIG. 2, and is connected to the inputs 124 of discriminator 12 and 144 of discriminator 14, which correspond to the inputs 104 in FIG. 2. Thus discriminators 12 and 14 cannot be triggered unless discriminator 13 is triggered first.

Figure 3:
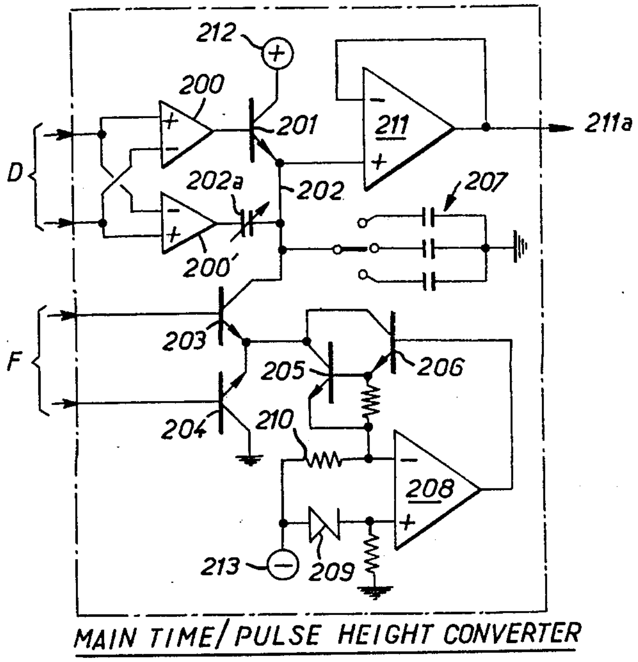
FIG. 3 is a block schematic of a principal time to pulse height converter.

Each of the principal time to pulse height converters 21 and 22 of FIG. 1 is as shown in more detail in FIG. 3. It has balanced start and stop inputs (D and F) which are connected to the outputs 101 and 102, respectively, of the appropriate threshold discriminators. The two lines of the balanced start input (D) are connected as follows: one goes to the non-inverting input of a differential amplifier 200 and to the inverting input of a differential amplifier 200', and the other goes to the non-inverting input of amplifier 200' and the inverting input of amplifier 200. As a result, the output signals of the two differential amplifiers are equal in amplitude and in anti-phase. The output of the amplifier 200 is connected to the base of an npn transistor 201 with its collector connected to a positive voltage source 212 and its emitter connected to a point 202. The output of the amplifier 200' is connected to the point 202 through a neutrodyne capacitor 202*a*. The point 202 is connected to the non-inverting input of a buffer amplifier 211 which has its output connected to its inverting input. The output 211*a* of the amplifier 211 is the output of the converter. The point 202 is also connected through a switch and one of a set of capacitors 207 to ground.

The two lines of the balanced stop input (F) are connected to the bases of an npn transistor 203 and a pnp transistor 204. The collector of transistor 203 is connected to the point 202, and that of transistor 204 is grounded. The emitters of the transistors 203 and 204 are connected together and to the output of a constant current source which comprises two transistors 205 and 206 connected as a Darlington pair. These modulate the output current from a differential amplifier 208 which has its non-inverting input connected to a negative voltage source 213 through a zener diode 209 and its inverting input connected to the source 213 through a resistance 210, which passes a constant current.

In the ready or waiting state, the transistors 201 and 203 are conducting and the transistor 204 cut-off. The constant current set by the Darlington pair 205/206 passes through the transistors 201 and 203. Initially, the voltage at point 202 is substantially equal to the base voltage of the conducting transistor 201, which is then cut off by the triggering of the discriminator connected to the start input (D). The switching transient which passes through the base-emitter capacitance of the transistor 201 is cancelled out at point 202 by a transient from the neutrodyne capacitor 202*a* which has the same amplitude and the opposite polarity. The capacitor 207 is charged by the constant current from the source 213, and the voltage across it decreases linearly from the initial value at point 202. When the threshold discriminator connected to the stop input (F) triggers, the transistor 203 is cut off and the transistor 204 begins to conduct. The constant current flows to ground through the transistor 204, and the charging of the capacitor 207 is interrupted. Subsequent resetting of the threshold discriminators returns the converter to the ready or waiting state.

Figure 4:
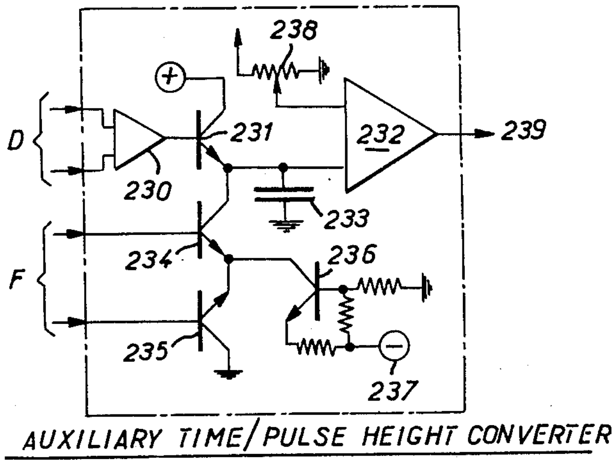
FIG. 4 is a block schematic of an auxiliary time to pulse height converter, connected to a threshold discriminator.

Each of the auxiliary time to pulse height converters 23 and 24 of FIG. 1 is as shown in detail in FIG. 4. It has a balanced start input (D) connected to an amplifier 230 driving a switching transistor 231. A balanced stop input (F) has one line connected to the base of an npn transistor 234 and the other connected to the base of a pnp transistor 235. In the ready or waiting state the former is conducting and the latter cut-off. The emitter of transistor 231 is connected to the collector of transistor 234, and is also grounded through a capacitor 233. During the time which elapses between the cutting off of transistor 231 by a start signal on the input D and the changeover of the states of transistors 234 and 235 in response to a stop signal on the input F, capacitor 233 is charged by a constant current drawn from a source 237 and regulated by a transistor 236. A differential amplifier 232 has one input connected to a potentiometer 238 connected across a source of reference voltage, and the other input connected to the emitter of transistor 231. The amplifier 232 provides a signal at its output 239 when the voltage across the capacitor 233 reaches a threshold value defined by the voltage set by the potentiometer 238. This occurs when no stop signal appears at input F within a predetermined period starting with the appearance of the start signal at input D.

Figure 5:
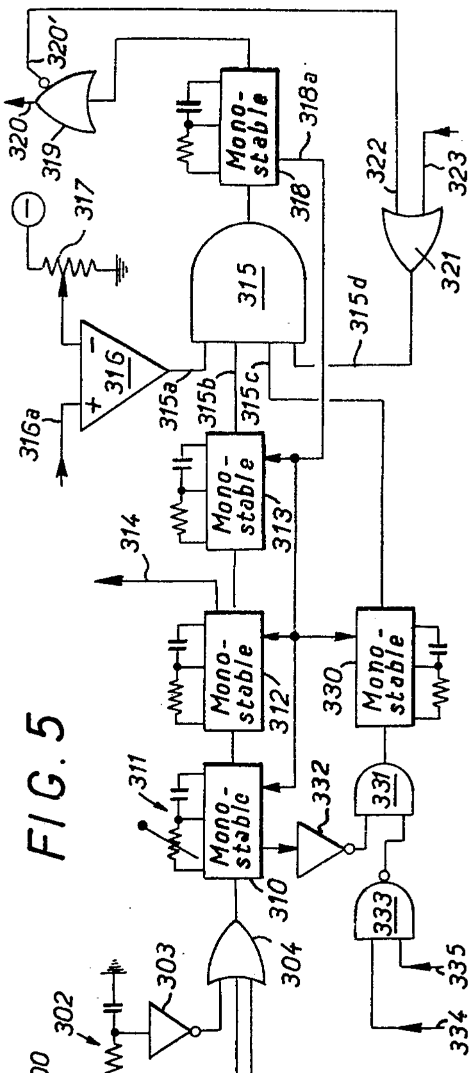
FIG. 5 is a block schematic of control circuitry of the device.

FIG. 5 shows the control circuitry of the device in more detail. The structure and function of this circuitry has been described in a somewhat simplified manner in relation to FIG. 1. It has inputs 300 and 301 which are set to "0" in response to triggering of the discriminators 13 and 14, respectively (FIG. 1). These signals are applied to two inputs of a three-input OR gate 304. Input 301 is also connected to an integrator 302 which consists of a resistor and capacitor. The output of the integrator 302 is connected through an inverter 303 to a third input of the OR gate 304.

The output of gate 304 is connected to the input of a delay monostable 310 which has an adjustable time constant set by a circuit 311. The trailing edge of the output pulse from the delay monostable 310 triggers a drive monostable 312, which has an output 314 connected to the control input of the linear gate 33 (FIG. 1). The monostable 312 is also connected to a monostable 313 which is triggered by the trailing edge of the pulse from monostable 312. Monostable 313 applies a "0" to input 315b of an AND gate 315, which functions in negative logic as an "OR" function gate, i.e. it outputs a "0" when there is at least one "0" input. This "0" output triggers a monostable 318 which outputs a positive pulse ("1") to an OR gate 319, which has a direct output 320 and an inverting or complemented output 320'. The direct output 320 is connected to the reset inputs of discriminators 11 to 14 (FIG. 1).

Triggering of the delay monostable 310 outputs a negative pulse to an inverter 332 which has its output connected to one input of an AND gate 331. The other of the two inputs of the AND gate 331 is connected to the output of a two-input NAND gate 333, which has an input 334 connected to the output of the auxiliary time to pulse height converter 23 and an input 335 connected to the output of the auxiliary time to pulse height converter 24 (see FIG. 1). The output of the gate 331 triggers a monostable 330, which outputs a negative pulse to an input 315*c* of the AND gate 315.

When the monostable 318 outputs a reset pulse to the OR gate 319, it simultaneously applies an inhibit pulse to line 318*a*, which is connected to inhibit inputs of monostables 310, 312, 313 and 330.

A threshold comparator 316 has one input 316a connected to the output of the time to pulse height converter 21 (FIG. 1), and the other input connected to the cursor of a potentiometer 317 connected across a reference voltage source. When the voltage on input 316*a* reaches the threshold defined by the voltage on the other input, the discriminator 316 is triggered, and applies a "0" to an input 315*a* of the AND gate 315.

The fourth and final input 315*d* of the gate 315 is connected to the output of an OR gate 321 which operates in negative logic as an "AND" function gate. An input 322 of the two-input gate 321 is connected to the complemented output 320' of the OR gate 319, and an input 323 is connected to the output of the discriminator 11 (FIG. 1).

OPERATION

The operation of the device will now be described with reference to FIGS. 1 and 6, this description to be followed by a description of the operation of the control circuitry, given with reference to FIGS. 5 and 7.

A negative-going first pulse 410 arrives on input 1, followed by a negative-going second pulse 420 on input 2. These first and second pulses are correlated, i.e. they are generated by respective detectors responding to respective events which are characteristic of the progression of a particular phenomenon, and mark the beginning and the end of a time interval constituting a stage of the phenomenon. For example, the two correlated events could be two nuclear transitions, corresponding to the creation and disappearance of a short-lived nuclide. If non-correlated pulses appear on the inputs of the device it will still operate, but the time interval measurement it gives will be meaningless.

Figure 6:
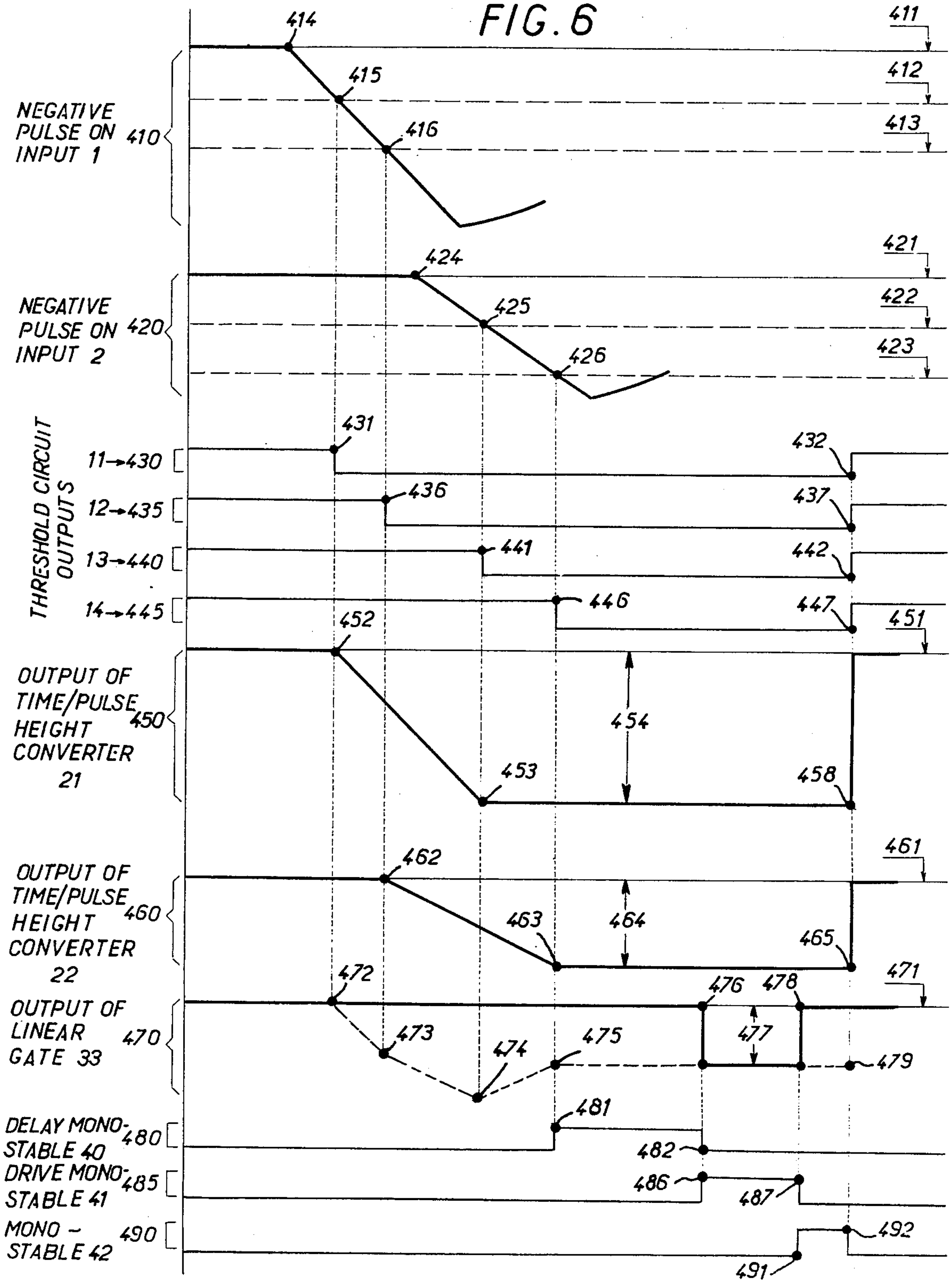
FIG. 6 is a timing diagram relating to the operation of the device.

The first pulse 410 starts from zero level at 414, as shown in line 410 in FIG. 6, where the zero level is referenced 411. The amplitude of the pulse 410 then passes through level 412 at point 415 and level 413 at point 416, level 413 being twice level 412. Likewise, as shown in line 420, the second pulse starts from the zero level 421 (point 424) and passes though levels 422 and 423 at points 425 and 426, respectively, level 413 being equal to level 423 and level 412 to level 422. Levels 413 and 423 are the threshold levels of the discriminators 13 and 14, set by the position of the slider of the potentiometer 15. Levels 412 and 422 are the threshold levels of the discriminators 11 and 12, and are derived from levels 413 and 423 by the potential divider 16/17. The resistors 16 and 17 are of the same value, so that levels 412 and 422 are half the levels 413 and 423.

As the amplitudes of the first and second pulses 410 and 420 pass through the respective thresholds at points 415, 416, 425 and 426, the discriminators 11 to 14 are triggered, in the order 11, 13, 12, 14, as shown by the points 431, 436, 441 and 446 in lines 430, 435, 440 and 445 of FIG. 6. Line 450 shows the output of the time to pulse height converter 21, which falls linearly from an initial level 451 (point 452, which corresponds to the triggering of the discriminator 11 at point 431) to a level 454 (point 453, which corresponds to triggering of the discriminator 12 at point 441). It then remains at this level 454.

Line 460 shows the output of the time to pulse height converter 22, as halved in amplitude by the potential divider 31/32. It starts from an initial level 461 which is equal to level 451, and falls linearly from a point 462 corresponding to triggering of the discriminator 13 to a point 463 corresponding to triggering of comparator 14 (436 to 446). The slope of the line joining points 462 and 463 is half that of the line joining points 452 and 453. The output of the converter 22 then remains at level 464.

The dashed line in line 470 of FIG. 6 shows the output of the differential amplifier 30, which is equal to the difference between the voltages shown in lines 450 and 460. This difference voltage passes from a "zero" level 471 at point 472 to a point 473, the slope of the line 472–473 being equal to that of the line 452–453. It then passes on to point 474, the slope of the line 473–474 being equal to that of line 452–453 minus that of the line 462–463. The difference voltage then increases from point 474 to point 475, the slope of this line being of the same magnitude as that of the line 462–463 but of the opposite sign.

The output of the differential amplifier 30 then remains at the level 477. It has been demonstrated above (see equations 1 to 4) that this level 477 is a measure of the time interval which separates the leading edges 414 and 424 of the first pulse 410 and the second pulse 420, respectively.

The shape of the output signal of the differential amplifier 30, as shown in FIG. 6, is the theoretical shape, which corresponds to a slow rate of operation. In reality, operating at high speed, the differential amplifier does not respond instantaneously to signals applied to its input. Since the output voltages of the converters 21 and 22 are stable after the point 475, however, the output voltage of the differential amplifier 30 will tend to progressively appproach the value 477.

Triggering of the discriminator 14 (point 446) triggers the delay monostable 40, which outputs a pulse shown in line 480 of FIG. 6, extending from point 481 to point 482. The trailing edge 482 of this pulse triggers the drive monostable 41 which outputs a pulse shown in line 485, extending from point 486 to point 487. This pulse opens the linear gate 33, so that the output voltage of the differential amplifier 30 can pass to the output 33b of the gate 33. This is shown by the full line in line 470, comprising a pulse at the stabilised level 477 extending from point 476 to point 478. The trailing edge 487 of the output pulse from the drive monostable 41 triggers the monostable 42 which outputs a pulse shown in line 490, extending from point 491 to point 492. The trailing edge 492 of this pulse resets the discriminators 11 to 14 (points 432, 442, 437 and 447), resets the converters 21 and 22 (points 455 and 465), and cancels the output of the differential amplifier 30 (point 479).

Figure 7:
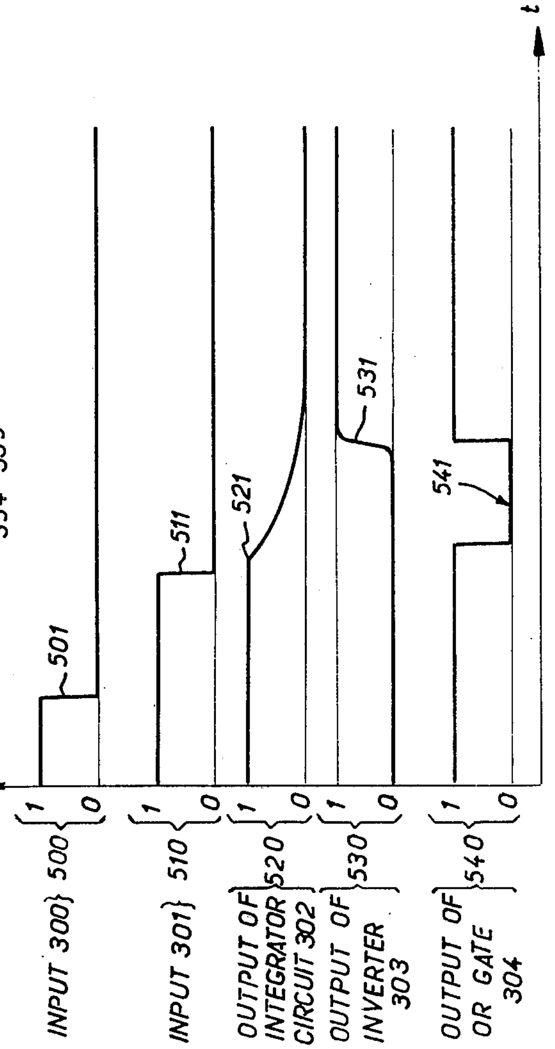
FIG. 7 is a timing diagram for a coincidence gate of the device.

Referring now to FIGS. 5 and 7, the signal applied to the input 301 by the triggered discriminator 14 is shown in line 510, at point 511. It is integrated by the integrator 302 to give the signal shown in line 520. The inverter 303 outputs a "1," as shown at point 531 in line 530, after a delay starting with the appearance of the "0" at point 511. The OR gate 304 outputs a "0" shown at 541 in line 540 when all its inputs are at "0," i.e. between the "0" 511 and the "1" 531, provided that the input 300, shown in line 500, is still at "0." In other words, the gate 304 outputs a "0" only if a "0" on input 300 (501) precedes a "0" on input 301 (511), i.e. if a start pulse precedes a stop pulse and both pulses have amplitudes which exceed the triggering thresholds of the device.

The output pulse from the monostable 318 which passes through the gate 319 resets the discriminators 11 to 14 (FIG. 1). Thus start and stop pulses with amplitudes sufficient to trigger the discriminators 11 to 14 in the normal sequence 11, 13, 12, 14, cause the following sequence of events: triggering of the delay monostable 310, triggering of the drive monostable 312 and opening of the linear gate 33 (FIG. 1), triggering of monostable 313, and triggering of monostable 318 to reset the input discriminators and return the device to the ready state.

If the start or stop pulse has an excessive rise time, this is detected by the auxiliary time to pulse height converter 23 or 24 (FIG. 1), which applies a "0" to input 334 or 335 of the NAND gate 333. If this occurs during the output pulse from the delay monostable 310, which indicates that the discriminators 11 to 14 (FIG. 1) are triggered, these discriminators are reset before the linear gate is opened by the drive monostable 312, by the reset signal output by the gate 319. At the same time, the output 318*a* of the monostable 318 applies an inhibit pulse to the monostables 310, 312, 313 and 330. Therefore, in the event of one of the input pulses having an excessive rise time, the linear gate is prevented from opening (monostable 312 inhibited), the input discriminators are reset (by monostable 318 via gate 319), and monostables 313 and 330 are inhibited to prevent them retriggering the monostable 318.

The discriminator 316 corresponds to the discriminator 46 shown in FIG. 1, and, as already explained, is triggered if the discriminator 12 is not triggered in a predetermined period starting from triggering of discriminator 11, i.e. if no stop pulse is received within a given time from the start pulse. This returns the device to the ready state.

If a new input pulse triggers discriminator 11 (FIG. 1) during the reset pulse from the monostable 318, the gate 321 outputs a "0"which retriggers the monostable 318, so that the device does not react to the new input pulse. This prevents errors due to pile-up.

MODIFICATION

Figure 8:
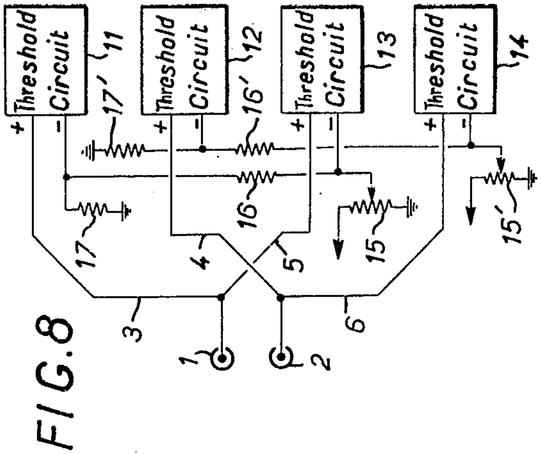
FIG. 8 shows a modified form of input circuit for the device.

FIG. 8 shows a modified form of input circuit for the device, which is used if the detectors which generate the start and stop pulses have different output levels.

The input terminals 1 and 2 are connected to the signal inputs (+) of the discriminators 11 to 14 in exactly the same way as in FIG. 1. The threshold-setting (−) input of discriminator 13 is connected to the slider of a potentiometer 15 connected across a voltage source (not shown), so that the potentiometer 15 forms a variable reference voltage source. This input is also grounded through a potential divider comprising resistors 16 and 17, the junction of which is connected to the threshold-setting input of discriminator 11. In a similar manner, the threshold-setting input of discriminator 14 is connected to a variable reference voltage source 15′ and grounded through a potential divider comprising the resistors 16′ and 17′, the junction of which is connected to the threshold-setting input of the discriminator 12. Resistors 16 and 16′ have the same value. Resistors 17 and 17′ have the same value, which is the same as that of resistors 16 and 16′ in the present example, as the threshold of discriminators 11 and 12 is half that of discriminators 13 and 14.

With this input arrangement, the thresholds for the discriminators 11 and 13 can be adjusted independently of those for the discriminators 12 and 14, to suit the amplitudes of the respective input pulses. The threshold ratios for the start and stop pulses are identical, however, because the potential dividers 16/17 and 16′/17′ are identical.

It will be appreciated that the accuracy of this device does not depend on the response times of the circuit elements, except for those of the input threshold discriminators 11 to 14 and the main time to pulse height converters 21 and 22. If the device is to be applied to nuclear science and to measuring time intervals of less than one nanosecond, only these four discriminators 11 to 14 and the two converters 21 and 22 need to use costly high speed components, ordinary components being used for the rest of the circuitry. As a result of this, the device can give excellent results at reasonable cost. For energy spectroscopy measurements, it is preferable to couple the device, in the usual manner, to a multichannel analyser. The range of possible measurements will be significantly extended on the low-energy side, due to the high sensitivity of the device to low-amplitude input pulses.

The control circuitry, as shown in FIG. 5, has been designed to prevent malfunctions resulting from the randon nature of the phenomena to be studied and the response characteristics of currently available detectors. The most probable types of malfunction have been given priority, but it will be appreciated that the probability that various types of malfunction will occur will vary with the application to which the device is put. In some applications, optimising the reliability of the device will call for modification of the details of the control circuity. For example, in application in which pulses appear at the inputs at a high rate, it would be advisable to reduce the delay associated with spontaneous resetting of the discriminators 11 to 14 after a pile-up. In this way, a centralised resetting control circuit can take action if no output signal is generated during a predetermined period starting with the triggering of the four discriminators.

Similarly, if the nature of the pulse on input 2 is such that the discriminator 14 frequently fails to trigger, it may be desirable to include an OR gate in the signal input circuit of the discriminator 46, with an input which is activated in response to excess output voltages from converters 21 and 22, in order to reduce the time for which the device is neutralised.

It will be understood that various modifications in the details, nature and arrangement of the elements which have been described herein for the purpose of explaining the nature of the invention may be made by those skilled in the art, without departing from the scope of the invention, as expressed in the following claims.

I claim:

1. A device for measuring the time interval separating the leading edges of first and second correlated pulses which have independent amplitudes and rise times, said device comprising:

(a) a first timing circuit including a first time to pulse height converter, a first threshold discriminator which responds to the first pulse passing through a first preset amplitude threshold by starting said first converter, and a second threshold discriminator which responds to the second pulse passing through said first preset amplitude threshold by stopping said first converter, the output signal of said first timing circuit being related to the duration of said time interval by a first conversion factor specific to said first timing circuit;

(b) a second timing circuit including a second time to pulse height converter, a third threshold discriminator which responds to the first pulse passing through a second preset amplitude threshold by starting said second converter, and a fourth threshold discriminator which responds to the second pulse passing through said second preset amplitude threshold by stopping said second converter, the output signal of said second timing circuit being related to the duration of said time interval by a second conversion factor specific to said second timing circuit; and (c) a differential output circuit which receives the output signals from said first and second timing circuits and provides at its output a signal proportional to the difference between the amplitudes of said timing circuit output signals, the arrangement of said first and second timing circuits being such that the ratio of said first to said second preset amplitude threshold is equal to the ratio of said second to said first timing circuit conversion factor, whereby said output signal from said differential output circuit is proportional to the duration of said time interval.

2. A device as set forth in claim 1, wherein the ratio of said first and second preset amplitude thresholds is ½.

3. A device as set forth in claim 1, comprising a variable reference voltage source and a potential divider connected across said source, the dividing ratio of said potential divider being equal to the ratio of said first and second preset amplitude thresholds, each of said threshold discriminators having an input for setting a threshold value, said threshold-setting inputs of said first and second threshold discriminators being connected to the intermediate point of said potential divider, and said threshold-setting inputs of said third and fourth threshold discriminators being connected to said source, each of said threshold discriminators also having a signal input, said signal inputs of said first and third threshold discriminators being connected to receive said first pulse, and said signal inputs of said second and fourth threshold discriminators being connected to receive said second pulse.

4. A device as set forth in claim 1, comprising first and second variable reference voltage sources and respective first and second potential dividers connected across said sources, the dividing ratio of each of said potential dividers being equal to the ratio of said first and second preset amplitude thresholds, each of said threshold discriminators having an input for setting a threshold value, said threshold-setting inputs of said first and second threshold discriminators being connected to the intermediate points of said first and second potential dividers, respectively, and said threshold-setting inputs of said third and fourth threshold discriminators being connected to said first and second sources, respectively, each of said threshold discriminators also having a signal input, said signal inputs of said first and third threshold discriminators being connected to receive said first pulse, and said signal inputs of said second and fourth threshold discriminators being connected to receive said second pulse.

5. A device as set forth in claim 1, wherein said first and second time to pulse height converters have the same intrinsic conversion factor, and wherein said differential output circuit includes a potential divider and a differential amplifier with a high intrinsic gain, said differential amplifier having an output which is connected to one end of said potential divider, which has its other end connected to the output of said second threshold discriminator, an inverting input which is connected to the intermediate point of said potential divider, and a non-inverting input which is connected to the output of said first threshold discriminator, the dividing ratio of said potential divider being equal to the ratio of said first and second preset amplitude thresholds, whereby the ratio of the overall conversion factor of said first to said second timing circuits is equal to the ratio of said second to said first preset amplitude threshold.

6. A device as set forth in claim 1, further comprising a linear gate in said differential output circuit and control circuitry connected to a control input of said linear gate, said control circuitry including: a coincidence gate in the form of a three-input OR gate, triggering of said third threshold discriminator causing the first input of said OR gate to be set to "0" immediately, and triggering of said fourth threshold discriminator causing the second input of said OR gate to be set to "0"immediately and the third input of said OR gate to be set to "1" after a predetermined delay; a delay monostable connected to the output of said OR gate and which is triggered by a "0" at said output; and a driver monostable which is triggered by the output of said delay monostable, the output of said driver monostable being connected to said control input of said linear gate, which opens in response to an output signal from said driver monostable.

7. A device as set forth in claim 6, wherein said second and fourth threshold discriminators have respective inhibit inputs which are activated in response to triggering of said third threshold discriminator to prevent further triggering of said second and fourth threshold discriminators.

8. A device as set forth in claim 6, further comprising: a first auxiliary time to pulse height converter which is started in response to triggering of said first threshold discriminator and stopped in response to triggering of said third threshold discriminator; a fifth threshold discriminator connected to the output of said first auxiliary time to pulse height converter; a second auxiliary time to pulse height converter which is started in response to triggering of said second threshold discriminator and stopped in response to triggering of said fourth threshold discriminator; a sixth threshold discriminator connected to the output of said second auxiliary time to pulse height converter; and a control circuit which provides an output signal in response to the delayed trailing edge of the first pulse or in response to triggering of the fifth of sixth threshold discriminator in response to the output of the first or second auxiliary time to pulse height converter passing through a preset amplitude threshold, each of said first, second, third and fourth threshold discriminators having a reset input which is connected to the output of said control circuit, said discriminators being reset in response to a signal on said output.

9. A device as set forth in claim 8, further comprising a gate connected between said fifth and sixth threshold discriminators and the input of said control circuit, said gate having a control input which is connected to the output of said delay monostable, and opening in response to a signal on said control input.

10. A device as set forth in claim 8, further comprising a seventh threshold discriminator which is connected to the output of said first time to pulse height converter, said control circuit also being responsive to triggering of said seventh threshold discriminator.

11. A device as set forth in claim 8, wherein said control circuitry further comprises a monostable which outputs a signal to said reset inputs of said first, second, third and fourth threshold discriminators, and to inhibit inputs of said delay and driver monostables.

12. A device as set forth in claim 11, wherein said control circuitry further comprises a gate which is opened in response to triggering of said first threshold discriminator to feed said output signal from said monostable to a control input of said control circuitry.

* * * * *

UNITED STATES PATENT AND TRADEMARK OFFICE

CERTIFICATE OF CORRECTION

PATENT NO. : 4,090,141

DATED : May 16, 1978

INVENTOR(S) : Michel LeBlanc

It is certified that error appears in the above-identified patent and that said Letters Patent are hereby corrected as shown below:

FORMULA 3, COLUMN 4, LINE 6 PLEASE CORRECT AS FOLLOWS:

"$T_o=(u_1=u_2)/K_1.(1-m)$" must read $T_o=(u_1-u_2)/K_1.(1-m)$

Signed and Sealed this

*Twenty-fourth* Day of *October 1978*

[SEAL]

*Attest:*

RUTH C. MASON
*Attesting Officer*

DONALD W. BANNER
*Commissioner of Patents and Trademarks*